(12) United States Patent
De Winter et al.

(10) Patent No.: US 7,307,690 B1
(45) Date of Patent: Dec. 11, 2007

(54) DEVICE MANUFACTURING METHOD, COMPUTER PROGRAM PRODUCT AND LITHOGRAPHIC APPARATUS

(75) Inventors: Laurentius Cornelius De Winter, Vessem (NL); Jozef Maria Finders, Veldhoven (NL); Maria Johanna Agnes Rubingh, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/642,984

(22) Filed: Dec. 21, 2006

(51) Int. Cl.
*G03B 27/42* (2006.01)

(52) U.S. Cl. .............................. 355/53; 355/67; 355/77

(58) Field of Classification Search .................. 355/30, 355/53
See application file for complete search history.

(56) References Cited

U.S. PATENT DOCUMENTS 7,233,386 B2 * 6/2007 Reisinger et al. ............. 355/55

* cited by examiner

*Primary Examiner*—D. Rutledge
(74) *Attorney, Agent, or Firm*—Pillsbury Winthrop Shaw Pittman LLP

(57) ABSTRACT

A method of optimizing adjustable settings of adjustable elements of a projection system in a lithographic apparatus is disclosed that includes determining an object spectrum for a pattern and an illumination arrangement, determining a symmetry of the object spectrum, constructing a merit function for a wave-front in a pupil plane of the projection system with the settings of the adjustable elements as variables with reference to the symmetry, and optimizing the merit function.

20 Claims, 3 Drawing Sheets

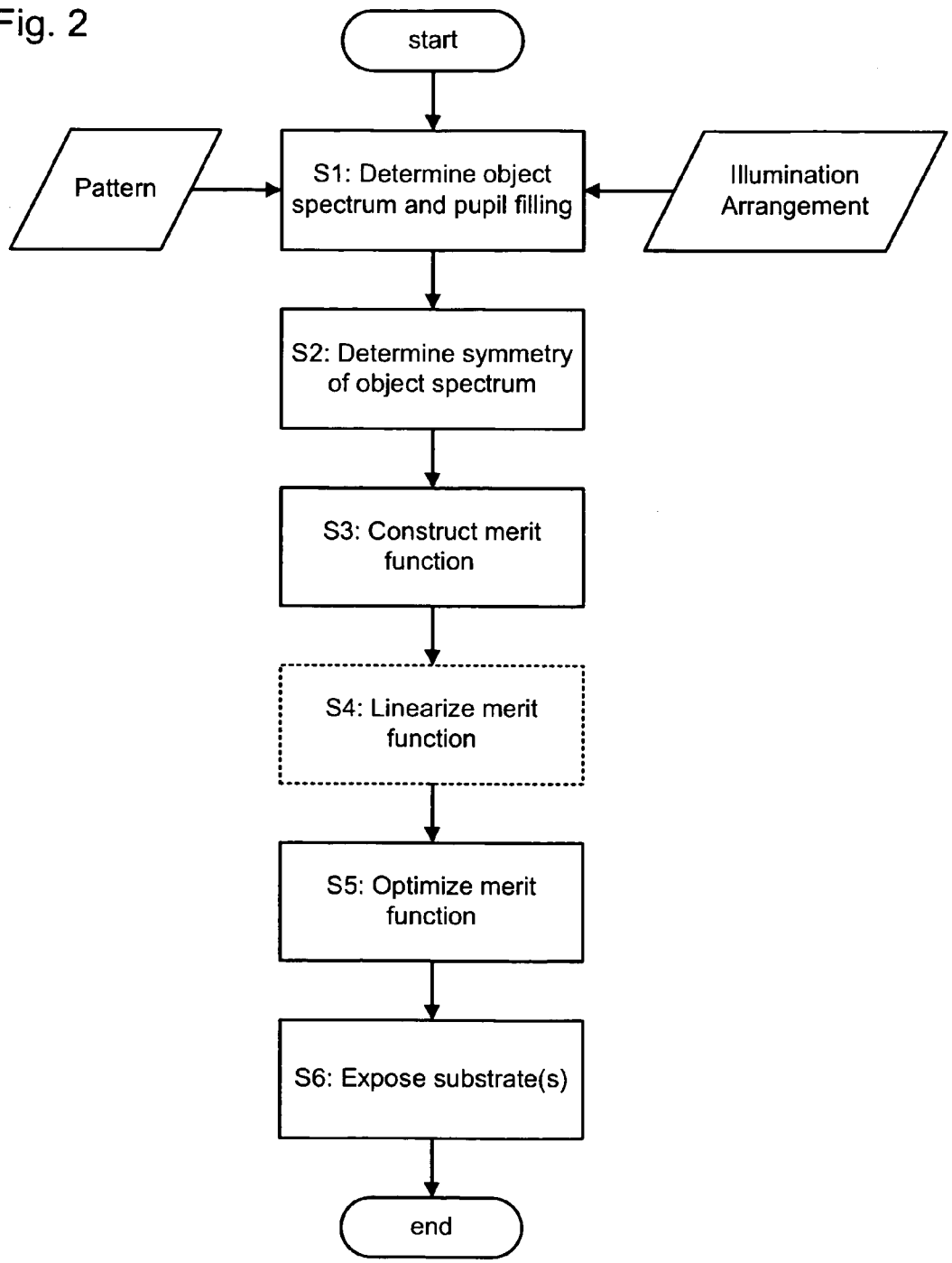

DEVICE MANUFACTURING METHOD, COMPUTER PROGRAM PRODUCT AND LITHOGRAPHIC APPARATUS

FIELD

The invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In optical projection lithography, a high-powered projection beam is generally used in order to reduce the time taken for an exposure and hence increase the throughput of the apparatus. Because the elements of the projection system used to project an image of the pattern onto the substrate are not perfectly transmissive or reflective, some energy from the beam will be absorbed. This energy causes the elements of the projection system to heat up, in spite of the provision of cooling systems, and change their shape or relative position. Any such changes introduce aberrations into the projected wave-front. This problem is generally known as "lens heating" as it is most problematic in refractive elements such as lenses.

In known attempts to address lens heating, the effects of lens heating are predicted on an exposure-by-exposure basis and adjustable elements in the projection system are adjusted to compensate. It is common to describe the aberrations caused by lens heating in terms of phase variations expressed in Zernike polynomials and to make adjustments to corresponding "knobs" provided for the projection system. However, it is difficult to provide an adjustable element that affects aberrations in only a single Zernike polynomial so a control system may be provided that presents virtual "knobs" corresponding one to one to Zernike polynomials and which for a given input adjusts several elements in the projection system whose net effect is the desired adjustment.

With the constant desire to improve image quality and resolution, improvements in compensation for lens heating effects are desired. In particular, steep phase gradients are often observed that cannot be expressed in low-order Zernike polynomials and are not well predicted or corrected for by known techniques. Flare and non-concentric phase-stripes due to mask manufacturing methods also produce aberrations that are difficult to correct.

SUMMARY

It is desirable, for example, to provide an improved method of correcting phase variations in optical projection lithography.

According to an aspect of the invention, there is provided a device manufacturing method comprising-projecting an image of a pattern illuminated with an illumination arrangement onto a substrate using a projection system having a pupil plane and a plurality of adjustable elements having respective settings, the method further comprising:
  determining an object spectrum for the pattern and illumination arrangement;
  determining a symmetry of the object spectrum;
  constructing a merit function for a wave-front in the pupil plane with the settings of the adjustable elements as variables with reference to the symmetry; and
  optimizing the merit function.

According to an aspect of the invention, there is provided a computer program product comprising instructions recorded on a computer readable medium, the instructions being adapted to control a lithographic apparatus to perform a device manufacturing method comprising projecting an image of a pattern illuminated with an illumination arrangement onto a substrate using a projection system having a pupil plane and a plurality of adjustable elements having respective settings, the method further comprising:
  determining an object spectrum for the device pattern and illumination arrangement;
  determining a symmetry of the object spectrum;
  constructing a merit function for a wave-front in the pupil plane with the settings of the adjustable elements as variables with reference to the symmetry; and
  optimizing the merit function.

According to an aspect of the invention, there is provided a lithographic apparatus comprising:
  a support constructed to support a patterning device, the patterning device being configured to present a pattern;
  an illumination system configured to illuminate the pattern with an illumination arrangement;
  a substrate table constructed to hold a substrate;
  a projection system having a plurality of adjustable elements having respective settings, the projection system configured to project an image of the pattern onto a target portion of the substrate; and
  a control system configured to control the illumination system and the adjustable elements of the projection system, the control system comprising:
    a first determination unit configured to determine an object spectrum for the pattern and illumination arrangement,
    a second determination unit configured to determine a symmetry of the object spectrum,
    a merit function construction unit configured to construct a merit function for a wave-front in the pupil plane with the settings of the adjustable elements as variables with reference to the symmetry, and
    an optimization unit configured to optimize the merit function.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a method according to an embodiment of the invention; and

DETAILED DESCRIPTION

Figure 1:
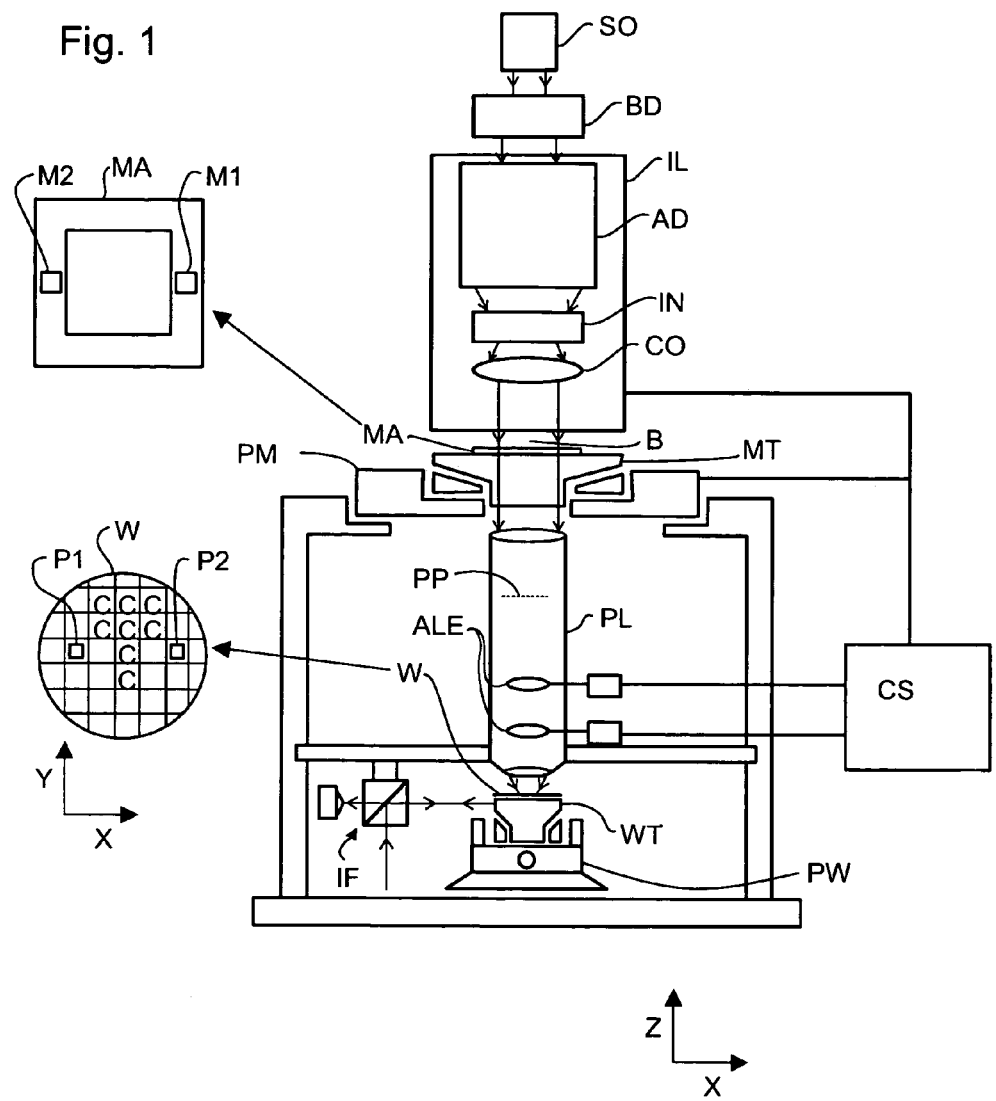
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a sp ace between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning-device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL can be adjusted by a number of actuated elements ALE, referred to as "knobs". The wave-front of the beam B reacts linearly to these elements. The effect on the wave-front of an adjustment of an actuated element may be complex so that to adjust one parameter of the projection system, e.g. the position of the plane of best focus, may require adjustment of several elements, for example one element may be used to shift the plane of best focus and other elements must then be adjusted to compensate for the other effects of the adjustment of that element. Thus, a control system CS is provided that presents virtual knobs relating to a single parameter and appropriately adjusts several actuated elements to obtain the desired effect. Design of such an arrangement is within the capability of the person skilled in the art and may be a combination of electronic hardware and software comprising respective units of software and/or hardware to perform the functions described herein.

An embodiment of the invention provides an algorithm which can be used by the control system CS to define and describe a merit function that can be optimized to determine the adjustments to be effected in the projection system PL to reduce or minimize errors, e.g. overlay and/or focus variation (over the slit and/or in time) for specific structures and illumination settings without having to use a complete simulation package. The algorithm of an embodiment of the invention optimizes directly the result of a linear operation on the wave-front and therefore avoids a problem that may occur in the use of higher order Zernike polynomials which may be needed, e.g., to describe a heated wave-front. Moreover, in an embodiment of the invention, only the points needed for imaging are considered with the right weighting. An embodiment of the invention can also determine a correction to be applied in the case of a wave-front that has roughness due to flare or that exhibits non-concentric phase-stripes.

An embodiment of the invention can provide a simpler process for correction of focus and overlay error in uni- or bi-directional structures, since no sensitivities are required and NA-scaling can be performed automatically. Moreover, an algorithm according to the invention can be general enough to optimize multiple pitches at once. An embodiment of the invention can also be combined, with advantage, with region of interest optimization. In an embodiment of the invention, the region of interest is constructed explicitly from the given structures and illumination. An embodiment of the invention can also be implemented as a linear operation on the wave-front and is therefore robust. An embodiment of the invention can provide improvement across the image field and can take into account the effect of scanning (e.g. fading) in a scanning-type lithographic apparatus.

The method is general, but can be applied most simply to lines of a limited number of orientations. An embodiment of the invention is applicable to both dry and immersion tools.

The method of an embodiment of invention will be explained below with reference to FIG. 3 and an exemplary pattern, comprising X- and Y-oriented lines through pitch.

Consider a wave-front $\Phi$, which is a matrix with specified phase-values in the pupil PP of the projection system. Such a wave-front is the diffraction pattern of a patterning device pattern within the pupil of the projection system and is referred to as the object spectrum. This may be determined, S1, by measurement with an interferometer, e.g. one integrated into the lithographic apparatus, or by simulation. In step S2, the wave-front is split into symmetric and anti-symmetric parts with respect to the diffraction plane:

$$\Phi_S = \frac{\Phi + \hat{\Phi}}{2}; \Phi_A = \frac{\Phi + \hat{\Phi}}{2} \quad (1)$$

where $\hat{\Phi}$ is the mirror image of the phase matrix $\Phi$ in the plane perpendicular to the diffraction plane (i.e., flipped along the Y-axis for vertical lines, and the X-axis for the horizontal lines).

The matrix $\Phi_S$ gives rise to focus effects, the matrix $\Phi_A$ gives rise to shifts in the direction of the diffraction plane. In fact, $\Phi_S$ corresponds to the summed effect of even Zernikes, and $\Phi_A$ to the summed effect of the odd Zernikes. For an immersion system, the wave-front should be divided by the refractive index of the immersion liquid, e.g. water, so as to describe imaging in this case by also reducing the wavelength and the NA. Exploitation of the symmetry facilitates the construction of the best focus (BF) condition, discussed further below.

For lines with a limited number of orientations, the symmetric and anti-symmetric parts of $\Phi$ are constructed for all relevant diffraction (or observation) planes. For structures with a more complex object spectrum, higher symmetry groups of $\Phi$ are constructed. For instance, the object spectrum for a contact-hole with orders {00, 0±1, ±10, ±1±1} in the NA is invariant under the (dihedral) $D_4$ symmetry. The equivalent of 4-wave would be the wave-front $$\frac{1}{8} \sum_{n=0}^{7} R(n\vartheta)\Phi(-)^n,$$

where R is the rotation matrix and $\vartheta=45°$. The spherical equivalent would be the same expression without a phase factor.

However, in many cases it suffices to fix X,Y by reflection in X- and Y-axes (since low order symmetries are often of interest) and then determine the position of the plane of best focus. In the latter case again the symmetries stated above are relevant, and the same procedure can be used.

The next step S3, is to determine the merit function, which begins with a determination of the diffraction strengths of the structures of the pattern to be imaged. For instance for attenuated lines the expression is:

$$S_n = -(1 + \sqrt{a}) \cdot \frac{cd}{p} \text{sinc}\left(\frac{n \cdot cd}{p}\right) + \delta_{n,0}, \quad (2)$$

where a is the attenuation and p the pitch of the line. For a broad range of applications S is real.

For more complex structures, the spectrum can be created with a Fast Fourier Transformation but with some patterns with multiple pitches it is more efficient to start from a TCC description. Alternatively strengths may be obtained from other sources.

Next, the best focus BF condition is created. In an aerial image the best-focus condition is simply given by:

$$\sum_{n,m} S_n S_m \sum_i (\gamma_i^n - \gamma_i^m) \cdot \sin(k \cdot ((\Phi_S^{n,i} - \Phi_S^{m,i}) - BF \cdot (\gamma_i^n - \gamma_i^m))) = 0 \quad (3)$$

where $k=2\pi/\lambda$ is the wave-number, indexes n and m run over the diffraction orders in the pupil and index i runs over the sample points of the illumination arrangement. This expression arises because the image is an incoherent sum of cosines and, for lines, the plane of best focus is the position where the image is minimized. Finally $\gamma$ is the direction cosine, and as such a simple function of the pupil coordinates:

$$\gamma = \sqrt{1 - \frac{NA^2(\sigma_x^2 + \sigma_x^2)}{n_w^2}}, \quad (4)$$

where $n_w$ is the refractive index of the medium, e.g. vacuum, air, water or another immersion liquid. For the phase $\Phi$ and the direction cosine $\gamma$, the index m merely shifts the pupil coordinate in the diffraction plane with the value $m\lambda/(pNA)$.

It will be noted that the best focus condition is nearly independent of the illumination polarization state. This is so because for a certain pitch the polarization dependence of the interference term is only a function of pitch, and therefore is an overall multiplication factor of the equation (3) above. Moreover, the effect of polarization can be straightforwardly implemented. Also, the BF position is independent of dose or target and the BF condition is only weakly dependent on the bias of lines through pitch. The reason is that the dominant contributions are of the $0^{th}$ order, which factorizes the linear bias term. Distortion of the image may lead in resist to slightly different positions. This is considered to be a second order effect, especially when shifts relative to the cold situation are considered. The radiometric factor gives only a small contribution. A measure for focus fading is the mismatch between the average derivative and the solution of the BF condition.

Equation (3) is easy to implement though it has the drawback that it is not linear, however there is quick convergence to the root when, as a starting point, the average derivative of the wave-front is used.

The magnitude of focus fading is accessible in this method by determining the width of the focus distribution around the best focus plane when the optical elements of the projection system are heated. Also, fading due to shift in the scanning direction (anamorphism) can be quantified. It is desirable to have the actual best focus plane in the hot situation as close as possible to the position of the best focus plane when the elements of the projection system are unheated. Moreover the best focus range and phase variations are desirably not much larger than a fraction of a wave. Therefore the objective is to have the argument of the sine as small as possible. The optimization can then be given as a linear operation on the wave-front by linearization, S4, of the sine. BF is then expressed as:

$$BF = \frac{\sum_{n,m} S_n S_m \sum_i (\gamma_i^n - \gamma_i^m) \cdot (\Phi_S^{n,i} - \Phi_S^{m,i})}{\sum_{n,m} S_n S_m \sum_i (\gamma_i^n - \gamma_i^m)^2} \equiv A \cdot \Phi \quad (5)$$

This expression appears complicated, but it is easy to evaluate. Alternatively the absolute value of the sine-sum could be considered, which is bounded by the maximum of a known function times the absolute of the argument of the sine. This leads to best focus expressed as an average derivative.

The best focus expression can be created for multiple pitches and multiple orientations and the $\|A \cdot \Phi\|$ terms can be added (e.g. by rms addition).

An optional extension of the construction of the merit function is create the overlay objective function. The construction of the objective function is similar to, but simpler than the best focus condition. In detail, the direction cosine $\gamma$ is replaced by $NA.\sigma$, where $\sigma$ is the two-dimensional pupil co-ordinate. Also this time reference is made to the antisymmetric part of the wave-front. The shift XY of a resolution structure is given by:

$$XY = \frac{\sum_{n,m} S_n S_m \sum_i (\sigma_i^n - \sigma_i^m) \cdot (\Phi_A^{n,i} - \Phi_A^{m,i})}{\sum_{n,m} S_n S_m \sum_i (\sigma_i^n - \sigma_i^m)^2} \equiv B \cdot \Phi \quad (6)$$

Again for multiple pitches and multiple orientations the $\|B \cdot \Phi\|$ terms can be summed and the expression can be linearized if desired.

The next step, S5, is the actual optimization with the actuated elements (knobs) that are available, which can be carried out by well known techniques. As discussed above, the projection system is provided with adjustable elements whose settings have a known, desirably linear, effect on the wave-front. Settings for these elements can be regarded as unknowns to be solved. To do this, the above described merit function can be optimized across the field. An additional criterion, that the contrast in the image is above a certain threshold, may also be imposed. The final step, S6, is exposure of a substrate with the adjusted elements.

The objective function is a sum, optionally a weighted sum, of the above-described norms $\|A \cdot \Phi\|$ and $\|B \cdot \Phi\|$. Since this method in fact minimizes also the even and odd Zernikes for which the structure is sensitive, this method also reduces metrics such as H-V and $L_1$-$L_2$ respectively.

Figures 3A, 3B:
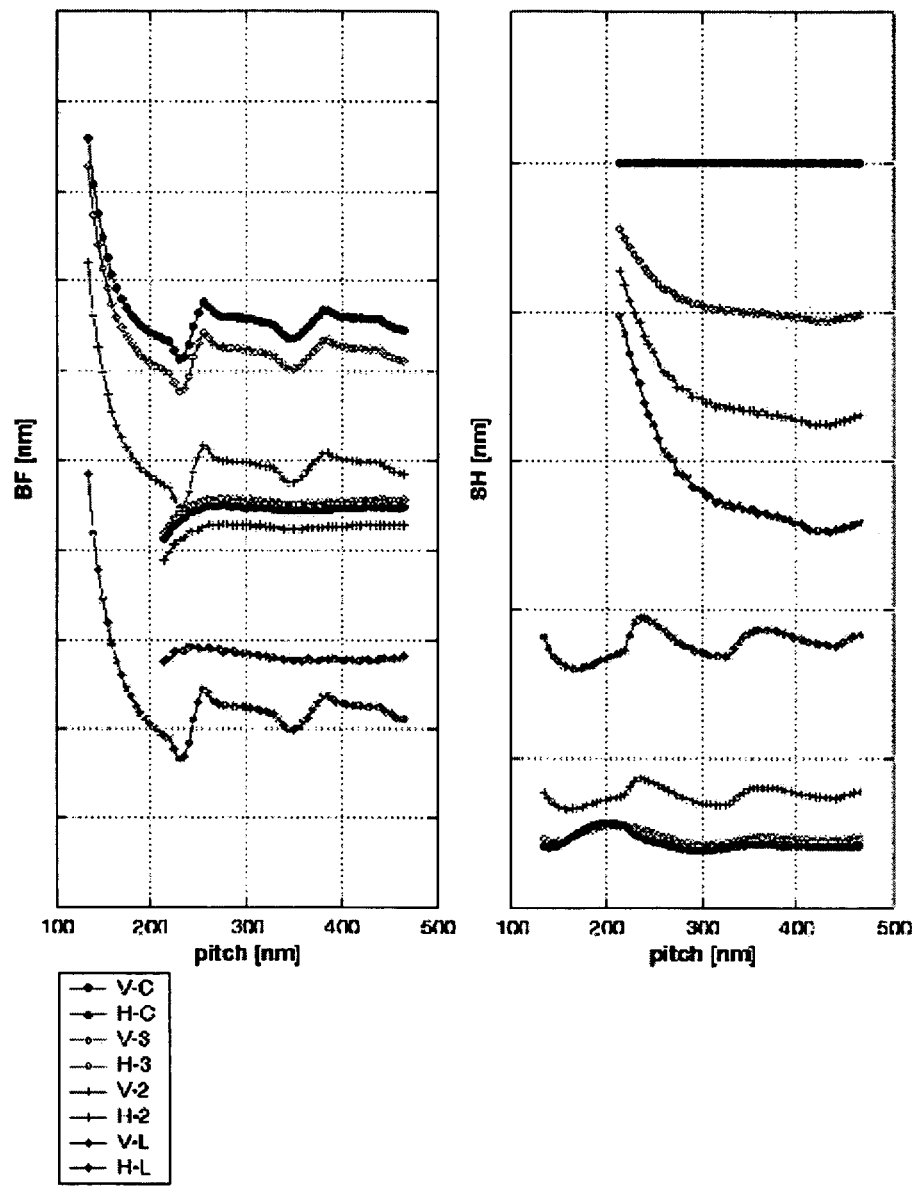
FIGS. 3A and 3B are graphs showing respectively merit function values for best focus and XY shift changes for different pitch values for various types of feature.

FIGS. 3A and 3B show examples of values of the best focus (BF) and pattern shift (SH) merit functions of an embodiment of the invention for differently oriented and positioned lines and different pitches, which accurately model the best focus and XY shift errors occurring in practice. In the caption to the graphs, the first letter indicates line orientation—V is Vertical and H is Horizontal—and the second letter indicates position in the field—L is Left, C is Central and 2 and 3 are points in between. The values were obtained using an X-dipole illumination arrangement. Having obtained such values, an optimum setting for the adjustable elements of the projection system to reduce or minimize best focus and shift error for the line pitch(es) and orientation(s) to be imaged can be found.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made-above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising projecting an image of a pattern illuminated with an illumination arrangement onto a substrate using a projection system having a pupil plane and a plurality of adjustable elements having respective settings, the method further comprising:

determining an object spectrum for the pattern and illumination arrangement;

determining a symmetry of the object spectrum;

constructing a merit function for a wave-front in the pupil plane with the settings of the adjustable elements as variables with reference to the symmetry; and optimizing the merit function.

2. The method of claim 1, wherein the merit function represents at least one variable selected from the group comprising focus and overlay in the projected image.

3. The method of claim 1, further comprising linearizing the merit function prior to the optimizing.

4. The method of claim 1, wherein the pattern comprises a plurality of linear features having a common orientation.

5. The method of claim 1, wherein determining the object spectrum comprises determining a function representing the phase of the wave-front in the pupil plane.

6. The method of claim 5, wherein the function representing the phase of the wave-front is a matrix of phase-values.

7. The method of claim 1, wherein constructing a merit function comprises determining diffraction strengths of structures in the pattern and the merit function includes a sum of diffraction strengths.

8. A computer program product comprising instructions recorded on a computer readable medium, the instructions being adapted to control a lithographic apparatus to perform a device manufacturing method comprising projecting an image of a pattern illuminated with an illumination arrangement onto a substrate using a projection system having a pupil plane and a plurality of adjustable elements having respective settings, the method further comprising:

determining an object spectrum for the device pattern and illumination arrangement;

determining a symmetry of the object spectrum;

constructing a merit function for a wave-front in the pupil plane with the settings of the adjustable elements as variables with reference to the symmetry; and optimizing the merit function.

9. The computer program product of claim 8, wherein the merit function represents at least one variable selected from the group comprising focus and overlay in the projected image.

10. The computer program product of claim 8, wherein the method further comprises linearizing the merit function prior to the optimizing.

11. The computer program product of claim 8, wherein the pattern comprises a plurality of linear features having a common orientation.

12. The computer program product of claim 8, wherein determining the object spectrum comprises determining a function representing the phase of the wave-front in the pupil plane.

13. The computer program product of claim 12, wherein the function representing the phase of the wave-front is a matrix of phase-values.

14. The computer program product of claim 8, wherein constructing a merit function comprises determining diffraction strengths of structures in the pattern and the merit function includes a sum of diffraction strengths.

15. A lithographic apparatus comprising:

a support constructed to support a patterning device, the patterning device being configured to present a pattern;

an illumination system configured to illuminate the pattern with an illumination arrangement;

a substrate table constructed to hold a substrate;

a projection system having a plurality of adjustable elements having respective settings, the projection system configured to project an image of the pattern onto a target portion of the substrate; and a control system configured to control the illumination system and the adjustable elements of the projection system, the control system comprising:

a first determination unit configured to determine an object spectrum for the pattern and illumination arrangement, a second determination unit configured to determine a symmetry of the object spectrum, a merit function construction unit configured to construct a merit function for a wave-front in the pupil plane with the settings of the adjustable elements as variables with reference to the symmetry, and an optimization unit configured to optimize the merit function.

16. The lithographic apparatus of claim 15, wherein the control system further comprises a linearization unit configured to linearize the merit function prior to the optimization.

17. The lithographic apparatus of claim 15, wherein the pattern comprises a plurality of linear features having a common orientation.

18. The lithographic apparatus of claim 15, wherein the first determination unit is configured to determine a function representing the phase of the wave-front in the pupil plane.

19. The lithographic apparatus of claim 18, wherein the function representing the phase of the wave-front is a matrix of phase-values.

20. The lithographic apparatus of claim 15, wherein the merit function construction unit is configured to determine diffraction strengths of structures in the pattern and the merit function includes a sum of diffraction strengths.

* * * * *